United States Patent [19]
Arkas et al.

[11] Patent Number: 5,424,735
[45] Date of Patent: Jun. 13, 1995

[54] ANALOGUE TO DIGITAL AND DIGITAL TO ANALOGUE CONVERTERS

[75] Inventors: Evangelos Arkas; Nicholas Arkas, both of London, United Kingdom

[73] Assignee: Advanced Intelligence Inc., Victoria, Canada

[21] Appl. No.: 120,595

[22] Filed: Sep. 13, 1993

[30] Foreign Application Priority Data

Sep. 15, 1992 [GB] United Kingdom ............ 9219455

[51] Int. Cl.⁶ .................................................. H03M 1/60
[52] U.S. Cl. ..................................... 341/157; 341/144
[58] Field of Search .................. 341/143, 157, 155, 144, 341/122, 111

[56] References Cited

U.S. PATENT DOCUMENTS

| | | |
|---|---|---|
| 3,311,842 | 3/1967 | Beck . |
| 3,761,916 | 9/1973 | Schenck ............... 341/111 X |
| 4,409,984 | 10/1983 | Dick . |
| 4,471,340 | 9/1984 | Lewis . |
| 4,584,565 | 4/1986 | Werba . |
| 4,718,036 | 1/1988 | Halbert et al. ............ 341/143 X |
| 5,159,281 | 10/1992 | Hedstrom et al. . |

FOREIGN PATENT DOCUMENTS 0256811  2/1988 European Pat. Off. .
3413051 10/1985 Germany .
1229349  9/1969 United Kingdom .

OTHER PUBLICATIONS

NUMA Technologies, "Period to Digital (P/D) Converter-Microprocessor-Compatible", NT302 Preliminary Data Sheet, Mar. 1, 1993.

C. R. Crego, Senior Staff Scientist, NUMA Technologies, "Period-to-Digital Converter-FM Detection", TB-1 Technical Brief, May 1993.

C. R. Crego, Senior Staff Scientist, NUMA Technologies, "Period-to-Digital Converter 256 Channel Tone Decoder", TB-2 Technical Brief, May 1993.

J. Markus, "Modern Electronic Circuits Reference Manual", 1980, *McGraw-Hill Book Company*, p. 404.

Primary Examiner—Brian K. Young
Attorney, Agent, or Firm—Merchant, Gould, Smith, Edell, Welter & Schmidt

[57] ABSTRACT

An analogue to digital converter has input for receiving an analogue signal and a frequency modulator for modulating the frequency of a carrier signal in dependence upon the analogue input signal. A digital counter counts the time between successive events in the modulated signal to provide digital signals representative of the analogue input signal.

13 Claims, 11 Drawing Sheets

ANALOGUE TO DIGITAL AND DIGITAL TO ANALOGUE CONVERTERS

BACKGROUND OF THE INVENTION

1. Field of the Invention

This invention relates to analogue to digital and digital to analogue converters.

2. Description of Related Art

Digital processing of analogue signals is widely known in the art because of the availability of analog-to-digital (A/D) and digital-to-analogue (D/A) converters. A/D and D/A converters are used to translate analogue information into digital form and digital information into analogue form, respectively. A/D and D/A converters are often used to interface between digital and analogue electronics.

An A/D converter accepts an analogue signal, typically comprising a sinusoidal varying waveform, and converts some characteristic of the analogue signal into a digital output such as a serial or parallel bit stream. This digital output can then be processed by digital circuits such as microprocessors, which in turn can be programmed to provide such functions as linear and non-linear gain characteristics, digital filtering, integration, differentiation, modulation, and other computations. Moreover, the digital output may be used directly or converted back into an analogue signal by the D/A converter. A D/A converter accepts a digital signal in the form of an N-bit parallel data word and converts it to an equivalent analogue representation.

SUMMARY OF THE INVENTION

According to a first aspect of the present invention, an analogue to digital converter comprises an input for receiving an analogue input signal, modulating means for modulating the angle of a carrier signal in dependence upon the analogue input signal and means for deriving from the modulated signal a digital signal representing the analogue input signal.

In a preferred embodiment, the modulating means is a frequency modulator for modulating the frequency of the carrier signal, which may be sinusoidal. The frequency modulator is preferably of the type which produces a signal whose frequency is a continuously varying function of the analogue input signal, such that sampling has not yet taken place. Thus, in such a case, a frequency multiplier may be provided to multiply the modulated signal whereby the resolution of the converter can be increased.

The means for deriving may be arranged to derive the frequency of the modulated signal by way of means, such as a digital counter, arranged to record the time taken for the phase angle of the modulated signal to rotate through a given angle. The given angle may be $n\pi$ radians and may be measured between zero crossings of the signal, detected by a zero crossing detector. In a preferred embodiment $n=1$ and the angle, or time, is measured between successive zero crossings.

According to a second aspect of the invention, there is provided a digital to analogue converter for converting digital signals, for example obtained using an analogue to digital converter according to the first aspect, and comprising an input for receiving digital signals and means for controlling the timing of the conversion of successive digital signals by amounts dependent upon values of the signals.

In one example, the delaying means comprises clocking means for clocking at a rate related to the value represented by the digital signals. Preferably, the digital to analogue converter provides a reconstitution of the modulated signal of the first aspect.

According to a third aspect of the invention there is provided a method of processing analogue data comprising angle-modulating a carrier with the analogue data, converting the modulated carrier to a series of digital signals representing durations between zero-crossings of the modulated carrier, storing and/or transmitting the digital signals, and reconstituting the modulated carrier from the stored and/or transmitted digital signals.

BRIEF DESCRIPTION OF THE DRAWINGS

Referring now to the drawings in which like reference numbers represent corresponding parts throughout.

DETAILED DESCRIPTION OF THE PREFERRED EMBODIMENT

In the following description of the present invention, reference is made to the accompanying drawings which form a part hereof, and in which is shown by way of illustration several embodiments in which the invention may be practiced. It is to be understood that other embodiments may be utilized and structural changes may be made without departing from the scope of the present invention.

Figure 1:
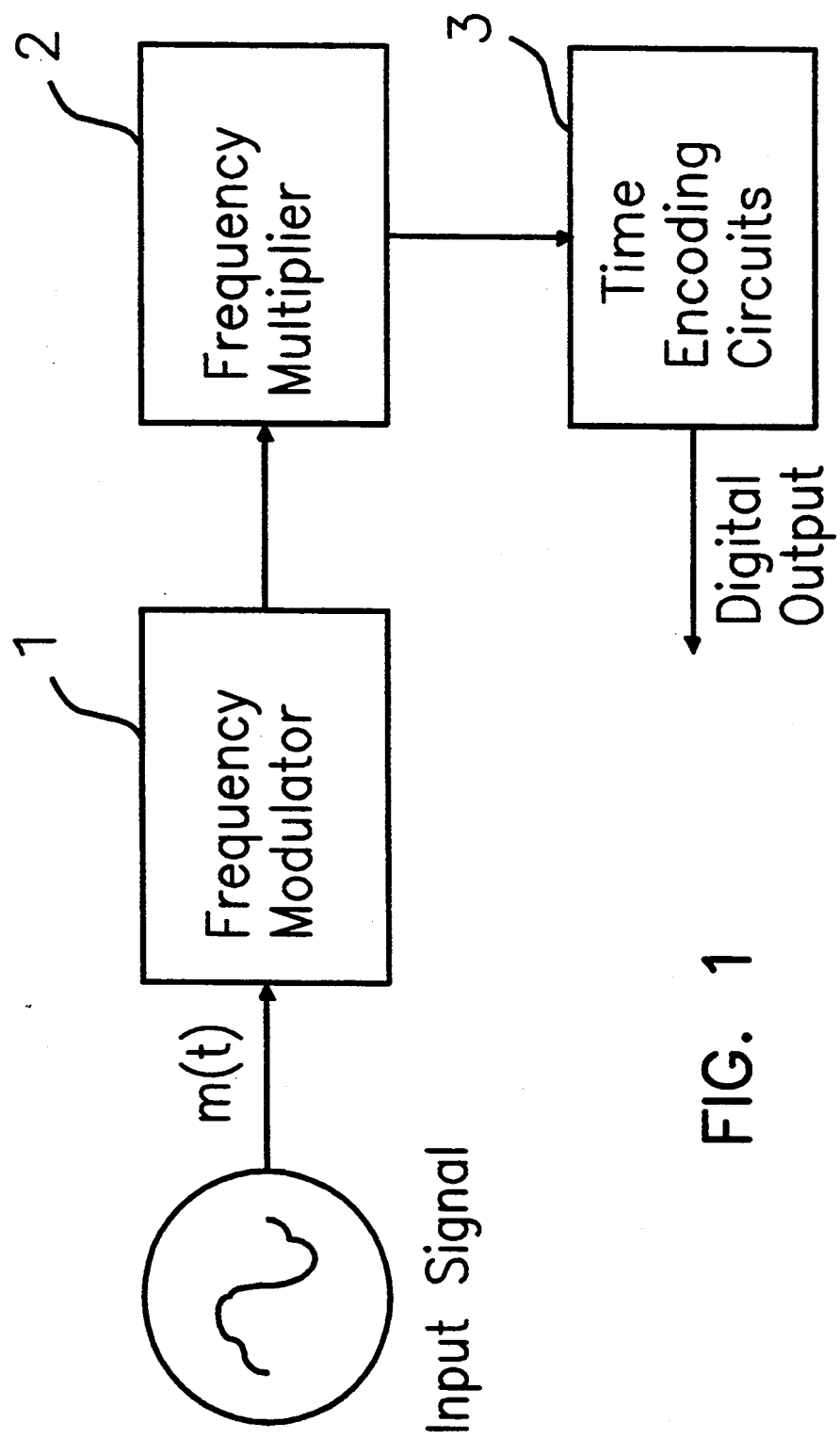
FIG. 1 shows a schematic diagram of an analogue to digital converter according to an embodiment of the present invention.
Figure 2:
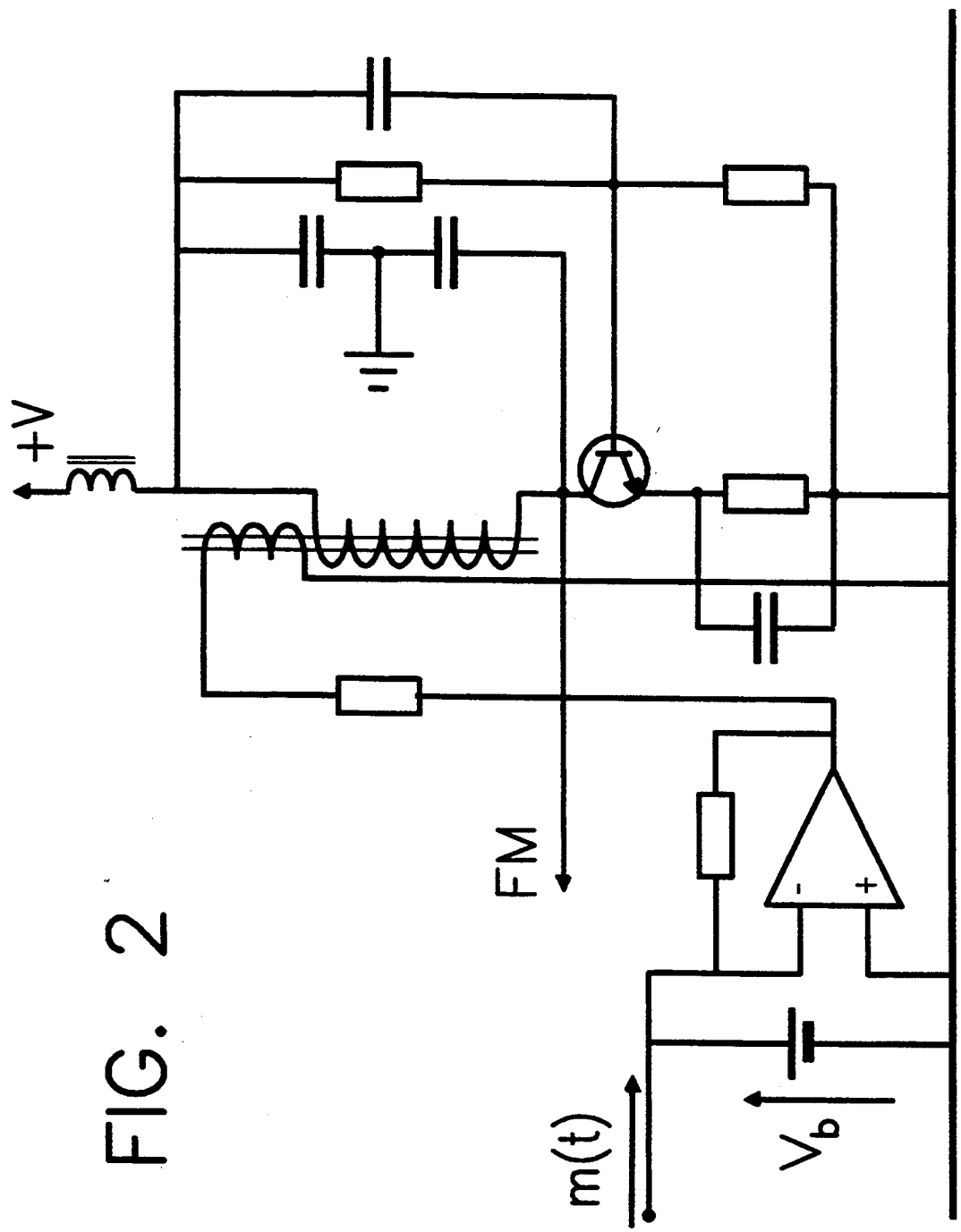
FIG. 2 shows a detailed circuit diagram of a frequency modulator of the converter of FIG. 1.

FIG. 1 shows a schematic diagram of an analogue to digital converter according to a first embodiment of the present invention and comprising a frequency modulator 1, an optional frequency multiplier 2 and a time encoding circuit 3. An analogue input signal m(t) which it is required to convert into a digital signal is input into the frequency modulator 1 having a carrier frequency of $f_c$ (angular frequency $\omega_c$). This circuit may be of any one of a variety of conventional types. For example it may be a voltage controlled oscillator such as a Colpitts oscillator as shown in FIG. 2 with a fixed input voltage bias $V_b$ to give the carrier of frequency $f_c$. The frequency modulator 1 internally generates the carrier as a sinusoidal carrier signal at frequency $f_c$. This frequency is modulated by an amount proportional to the analogue input signal to produce a modulated signal FM having an instantaneous angular frequency $\omega_i = \omega_c + km(t)$, where k is a constant. In other words, the rate of change of the phase angle of the carrier is increased or decreased according to the analogue input voltage.

In another form of this embodiment, the analogue input value is inverted in sign before being supplied to the frequency modulator so that the carrier periods increase and decrease with increase and decrease respectively in the amplitude of the input signal.

In order to obtain a digital conversion, one digitally ascertains this rate of change. This process is carried out by the time encoding circuit 3 which receives the modulated signal from the frequency modulator 1.

Figure 3:
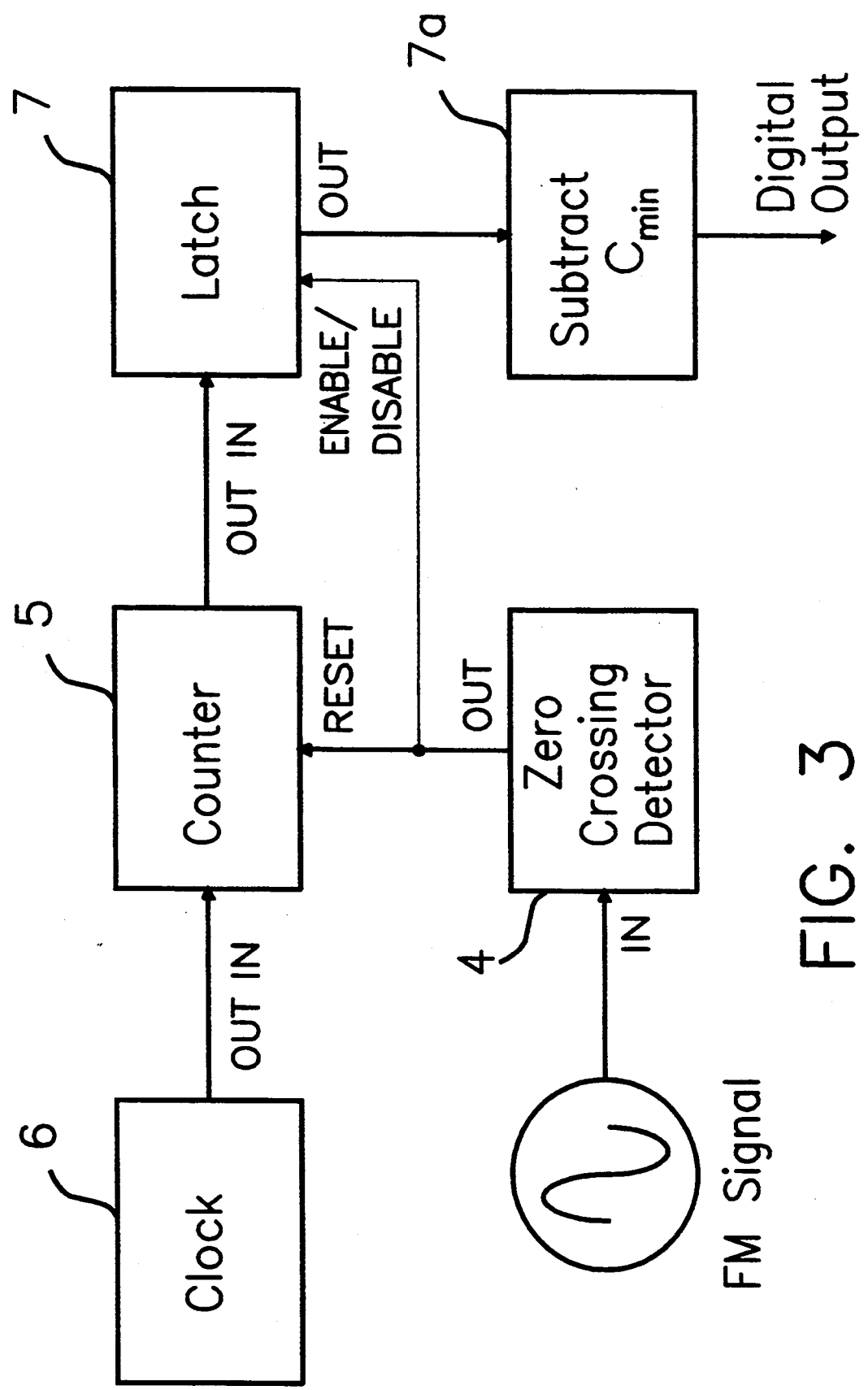
FIG. 3 shows a schematic diagram of a time encoding circuit of the converter of FIG. 1.

The time encoding circuit 3 determines the rate of change by observing the time taken for the phase angle to rotate through a known angle. FIG. 3 illustrates the time encoding circuit in more detail. This comprises at its input a zero crossing detector 4 which produces a short, positive, pulse each time the modulated signal crosses the zero reference. A pulse is therefore produced each time the phase angle of the modulated signal rotates through K radians. A digital counter 5 is connected to the output of the zero crossing detector. Upon receipt of a pulse, the counter is reset to 0 and commences counting clock pulses received from a clock 6. The counter may be a serial input-parallel output (SIPO) or a serial input-serial output (SISO) device. The output of the counter is connected to a latch 7. Upon receipt of a further pulse from the zero crossing detector the latch is triggered to store and transmit the digital word currently held by the counter, i.e., the count equivalent to the time period between the initiating pulse and the subsequent pulse, and the counter is again reset to zero and counting recommences.

The output from the latch is thus a stream of digital words representing successive values of m(t). This stream is "normalized" by digitally subtracting from it by subtractor 7a a value $C_{min}$ corresponding to the minimum half-cycle period of the modulation.

It will be apparent from the above that the converter samples the analogue input signal at intervals equal to successive $\pi$ radian phase changes of the modulated signal. If a lower sampling rate is required, samples could be taken every $n\pi$ radians, where n is an integer greater than 1. In order to increase the sampling rate, the carrier frequency and/or the bandwidth (2km(t)) can be increased to reduce the time period between zero crossings. It will also be apparent that, as the output of the modulator is a continuously varying function of the input, it retains all the information contained by the input, i.e., no sampling has taken place up to that point in the converter. The sampling rate can therefore be increased by multiplying the frequency of the output of the modulator. For example, doubling the frequency will double the sampling rate. FIG. 1 illustrates the optional use of a frequency multiplier 2, connected between the frequency multiplier and the time encoding circuit for this purpose.

Figure 4:
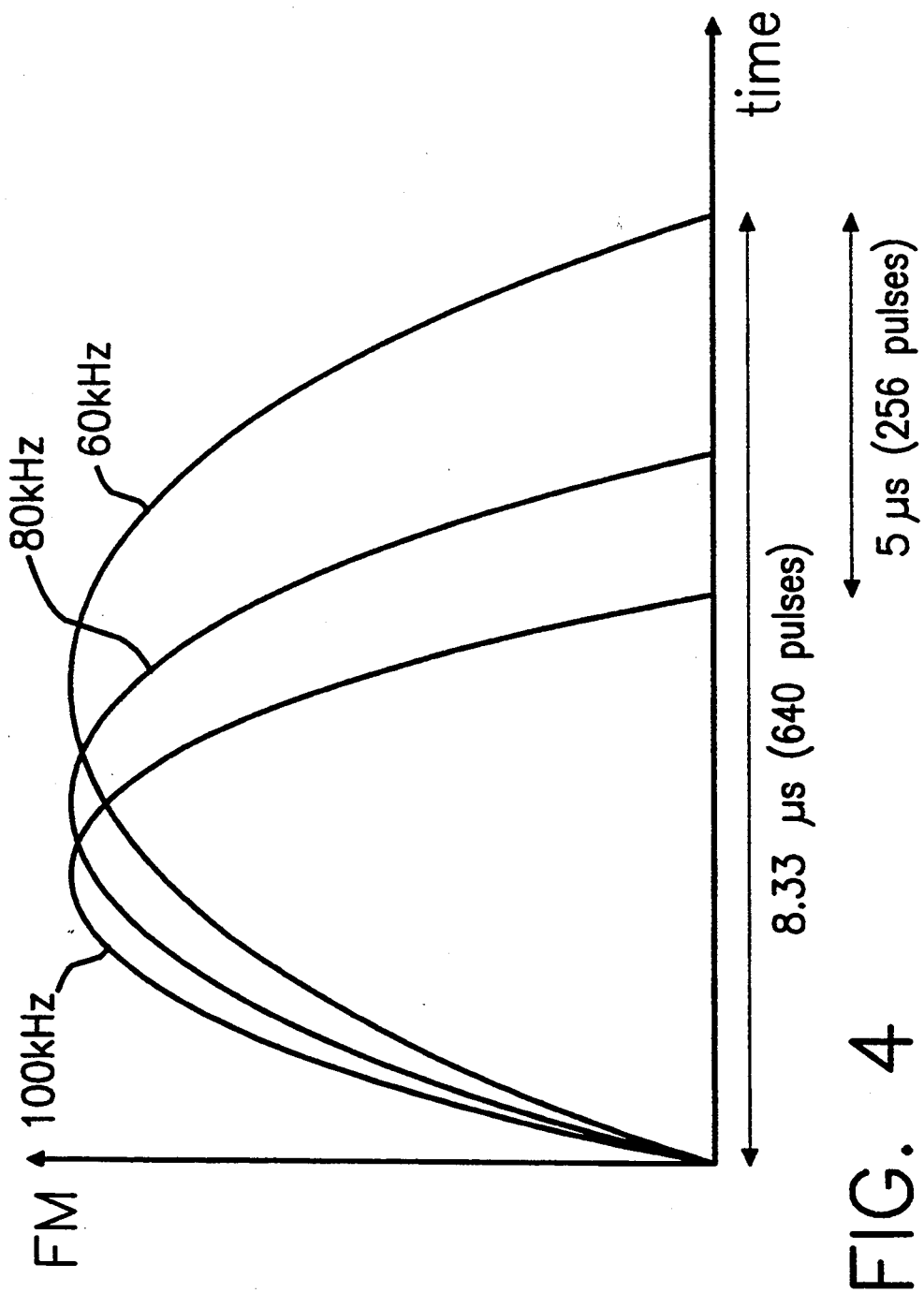
FIG. 4 illustrates the variation in the frequency produced by the converter of FIG. 1.

The resolution of the sampled values is dependent upon the frequency of the clock pulses counted by the counter. As an example, if it is required to digitize an analogue signal in the audio range, a sampling rate of 80 KHz would be appropriate. If the bandwidth of the modulated signal is 40 KHz, i.e., a deviation of + or −20 KHz for maximum and minimum signal inputs, the maximum and minimum time intervals between zero crossings will be 8.33 $\mu s$ and 5 $\mu s$ respectively. If 8 bit accuracy is required, giving 256 voltage levels between maximum and minimum time intervals, the number of counts from zero to the maximum time interval must be 640. This is illustrated in FIG. 4. The clock signal period must therefore be:

$$\frac{8.33 \, \mu s}{640} = 13 ns$$

i.e., a frequency of 76.8 MHz. An equation for determining the clock frequency C can be written as:

$$C = \frac{2^B (N^2 - 1) F}{N}$$

wherein
B = number of bits used to measure the time interval,
N = reciprocal of ½ the bandwidth divided by the carrier frequency (n = 80/20 = 4 in the above example),
F = carrier frequency in Hz.

The largest and smallest number of counts measured between zero crossings are provided by $C_{max}$ and $C_{min}$:

$$C_{max} = \frac{N}{2(N-1)} \frac{C}{F}$$

$$C_{min} = \frac{N}{2(N+1)} \frac{C}{F}$$

For a given clock frequency the resolution can be increased by decreasing the carrier frequency, i.e., by increasing the time interval between zero crossings. This will result in a decrease in sampling rate however.

It will be apparent that the digitization described above enables the data conveyed by the FM signal to be stored and/or transmitted efficiently and conveniently. The original FM signal can readily be reconstructed when required.

Figure 5:
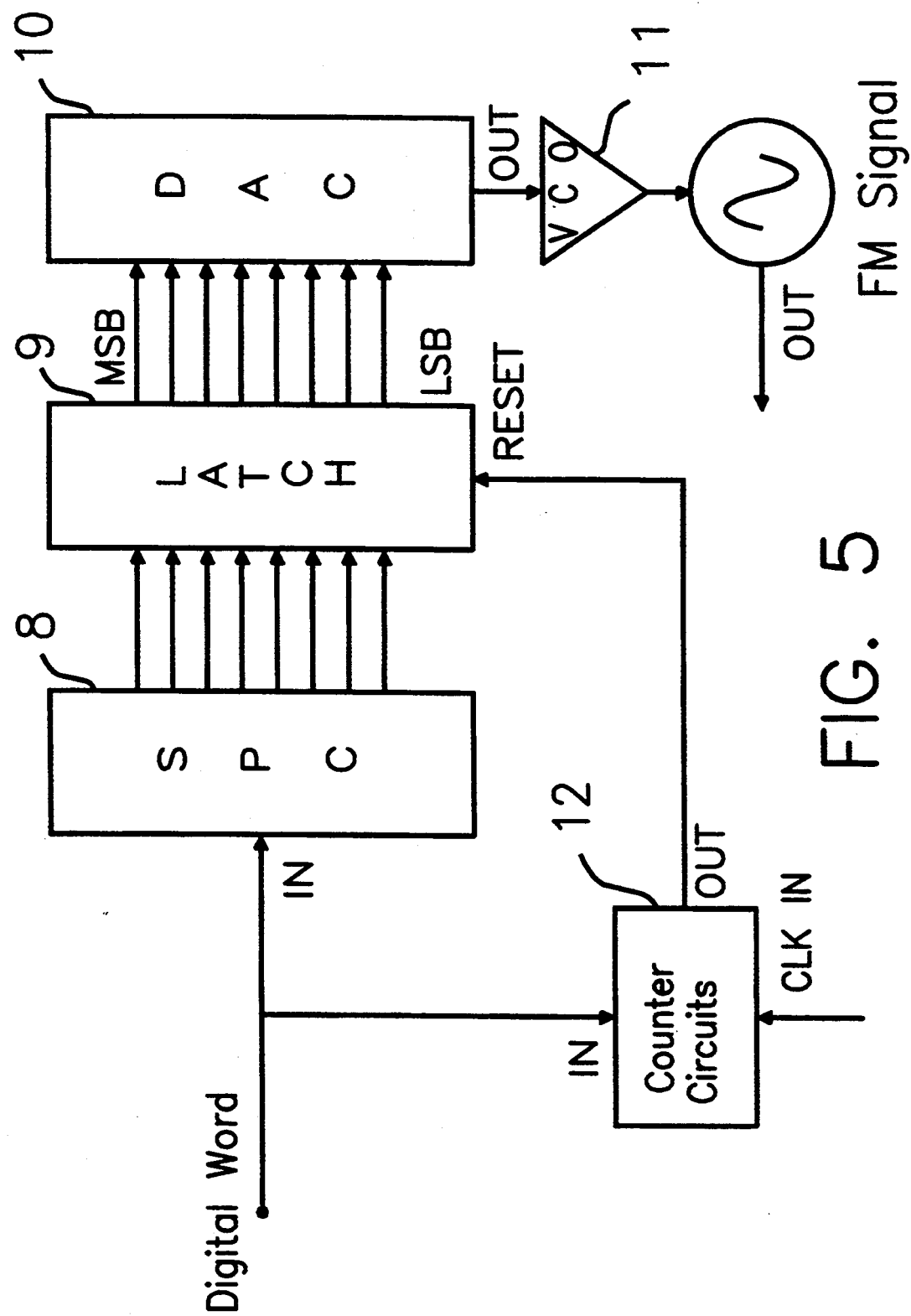
FIG. 5 shows a schematic diagram of a reconverter according to an embodiment of the present invention.

FIG. 5 illustrates a converter for reconstituting the frequency modulated signal produced by frequency modulator 1 from the digitized signal provided by subtractor 7a. The stream of digital words in serial form is passed to a serial-to-parallel converter 8 the output of which is passed to a digital-to-analogue converter 10 via a latch 9. The output of the converter is coupled to a voltage controlled oscillator or frequency modulator 11 which reconstructs the original FM signal which can be demodulated, if required, using a conventional discriminator.

The input words are also fed to a counter circuit 12. The counter counts up to the value given by each input word plus $C_{min}$ whereupon it emits a reset pulse to reset the latch. Thus, the latch 9 presents each captured word to the digital to analogue converter 10 for the time taken for the counter to count up to the value of the input digital word. At the end of the count, the counter accepts the next word present on its input and recommences counting up to the value of the new digital word.

Figure 6:
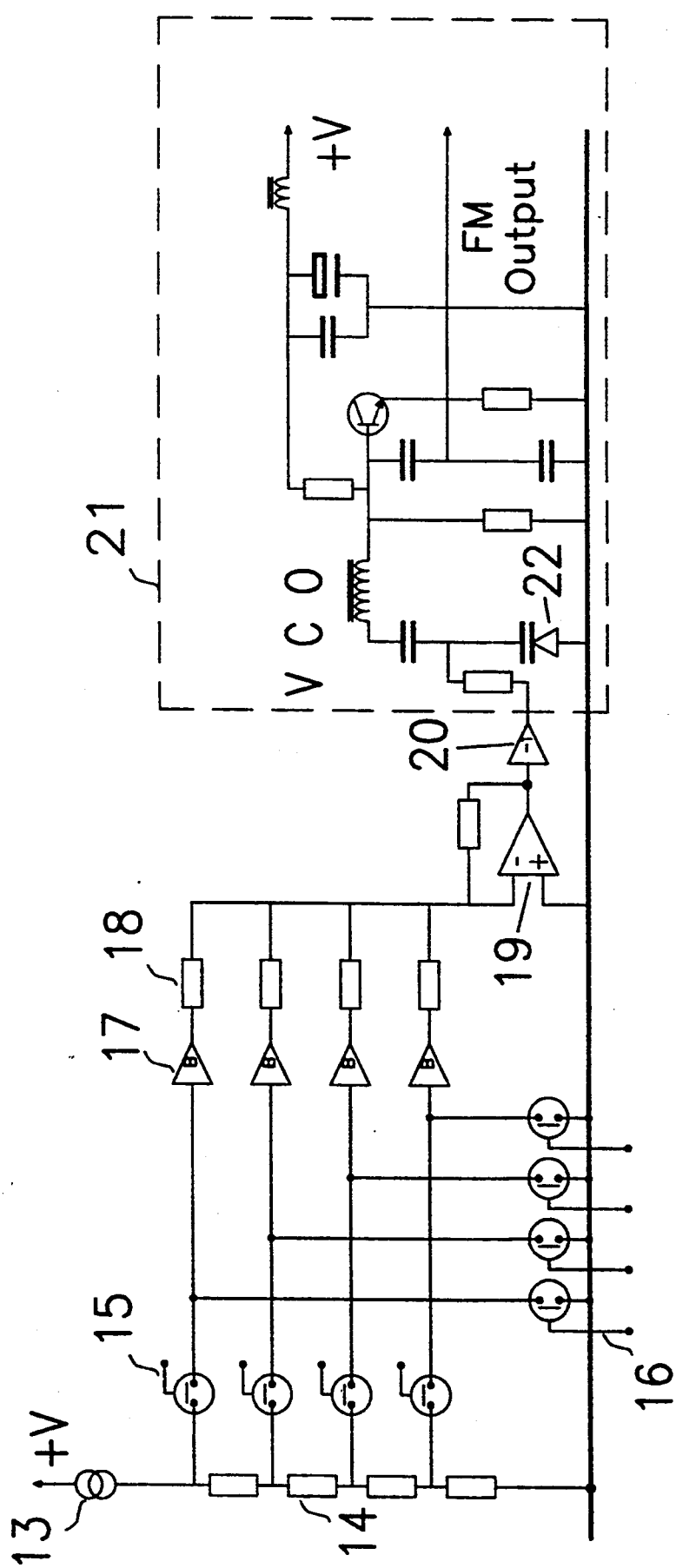
FIG. 6 shows a detailed circuit diagram of an embodiment of a DAC/VCO portion of the reconverter of FIG. 5.

FIG. 6 shows one possible embodiment of the DAC/VCO portion of the reconverter. A stable current source 13 supplies a resistor network 14 which is a voltage divider. The numbers in FIG. 6 next to the resistors correspond to their relative, not actual, values. The input from the latch 9 is fed to the two banks of gates 15,16. The gates of each bank are paired such that when one is off its partner is on and vice versa. When a "1" is present the gate in bank 15 is on and a voltage contribution is made. When a "0" is present the gate in bank 15 is off and no contribution is made. Its corresponding gate in bank 16 is on, which grounds the input of a corresponding unity gain buffer amp 17; thus no current is fed to the op-amp. The bank 16 gates are needed to quickly to switch off the current. If the bank 15 gate is on, the unity gain buffer amp 17 will give an output. The unity gain buffer amplifier isolates current summing resistors 18 from the voltage divider. The signal from all four (or n) channels is then summed by the bank of current summing resistors 18. The current is passed through an op-amp 19 (or a transconductance amp) and a unity gain inverter 16 to provide an analogue output signal.

In this manner, the reconverter outputs an intermediate analogue conversion for a time equal to the time over which the original analogue signal was "averaged" to produce the stored digital value.

The VCO portion 21 comprises a varicap diode 22, the capacitance of which is varied in dependence upon the output voltage of the op-amp 20 resulting in a variation in the resonating frequency of the VCO. The output signal (FM) is therefore a frequency modulated signal which is a reconstruction of the FM signal produced by the frequency modulator 1 in the analogue to digital converter described above.

Figure 7:
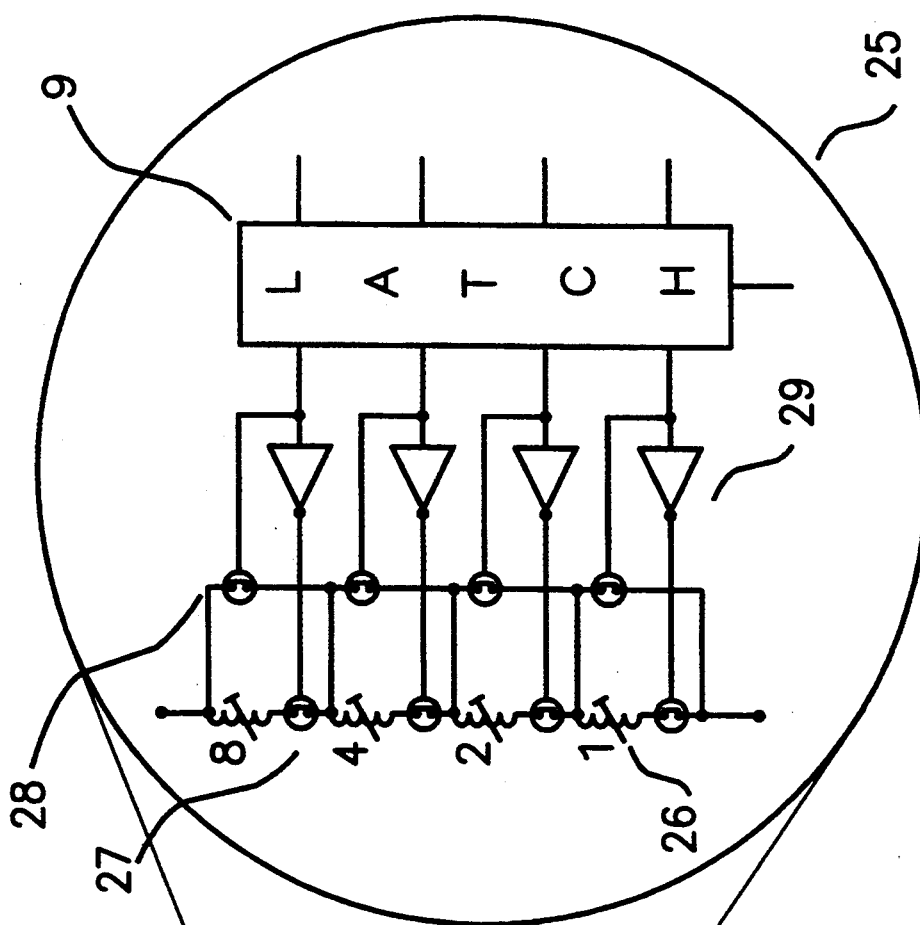
FIG. 7 shows an alternative embodiment of the DAC/VCO portion of FIG. 5.
Figure 7:
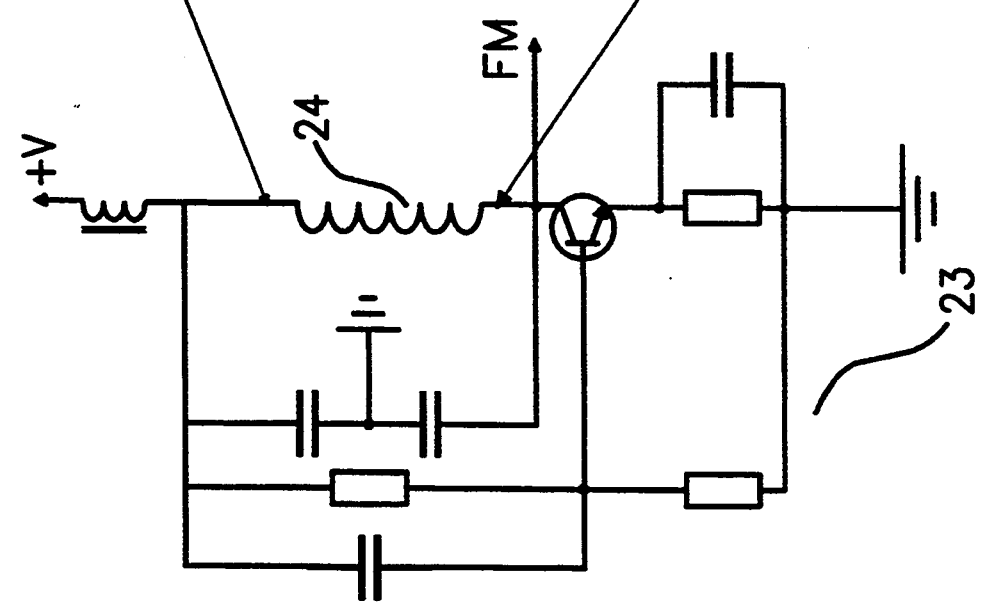

FIG. 7 shows an alternative DAC/VCO portion, including the latch 9. A Colpitts oscillator 23 comprises a number of inductors 26 as shown in the graphically expanded portion 25. Each output line of the latch controls a pair of gates 27,28 which operate in antiphase, due to inverters 29, such that the associated inductor 26 contributes additively to the overall inductance 24 only when the output is a "1". The resonant frequency of the oscillator is dependent upon the value of inductance 24 such that the output signal (FM) is frequency modulated in dependence upon the digital signal input to the converter. Again, the signal (FM) is a reconstruction of the signal produced by the frequency modulator 1.

Figure 8:
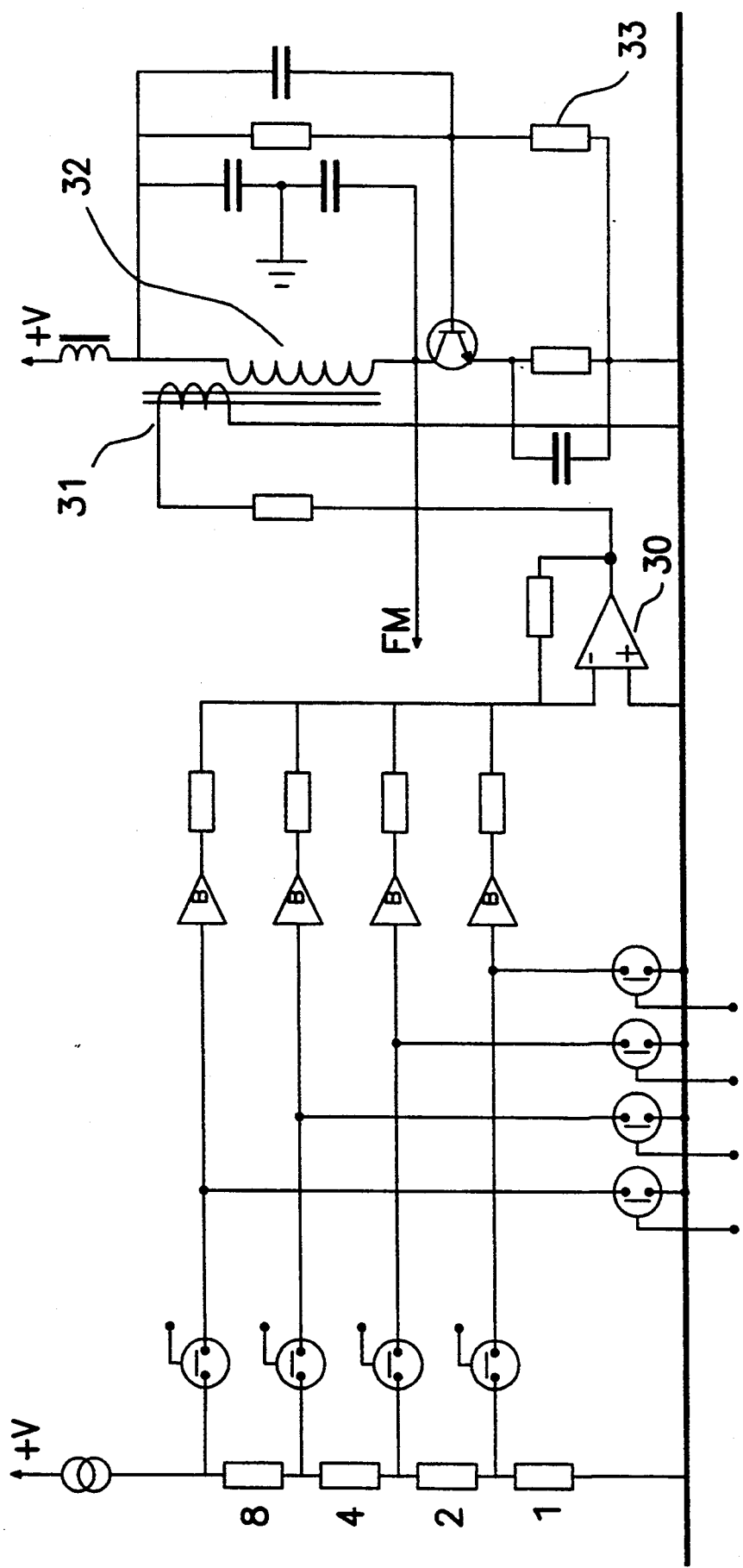
FIG. 8 shows a further embodiment of a portion of a reconverter according to an embodiment of the present invention.

FIG. 8 shows a variation on the circuits of FIGS. 6 and 7 utilizing parts of each and performing a similar function. The output from the current (transconductance) amp 30, or op-amp with isolating resistor, drives an inductor 31 sharing the same ferrite core as an inductor 32 in a Colpitts oscillator 33. Variation of the inductance and, therefore, resonating frequency is achieved. The resultant output is the same as that in FIGS. 6 and 7.

It is possible to use alternative embodiments to enhance the resolution of the present invention. For example, the alternative embodiments can measure the time intervals of:

1. zero crossing to subsequent peak,
2. peak to subsequent zero crossing,
3. zero crossing to subsequent trough, or
4. trough to zero crossing.

Figure 9:
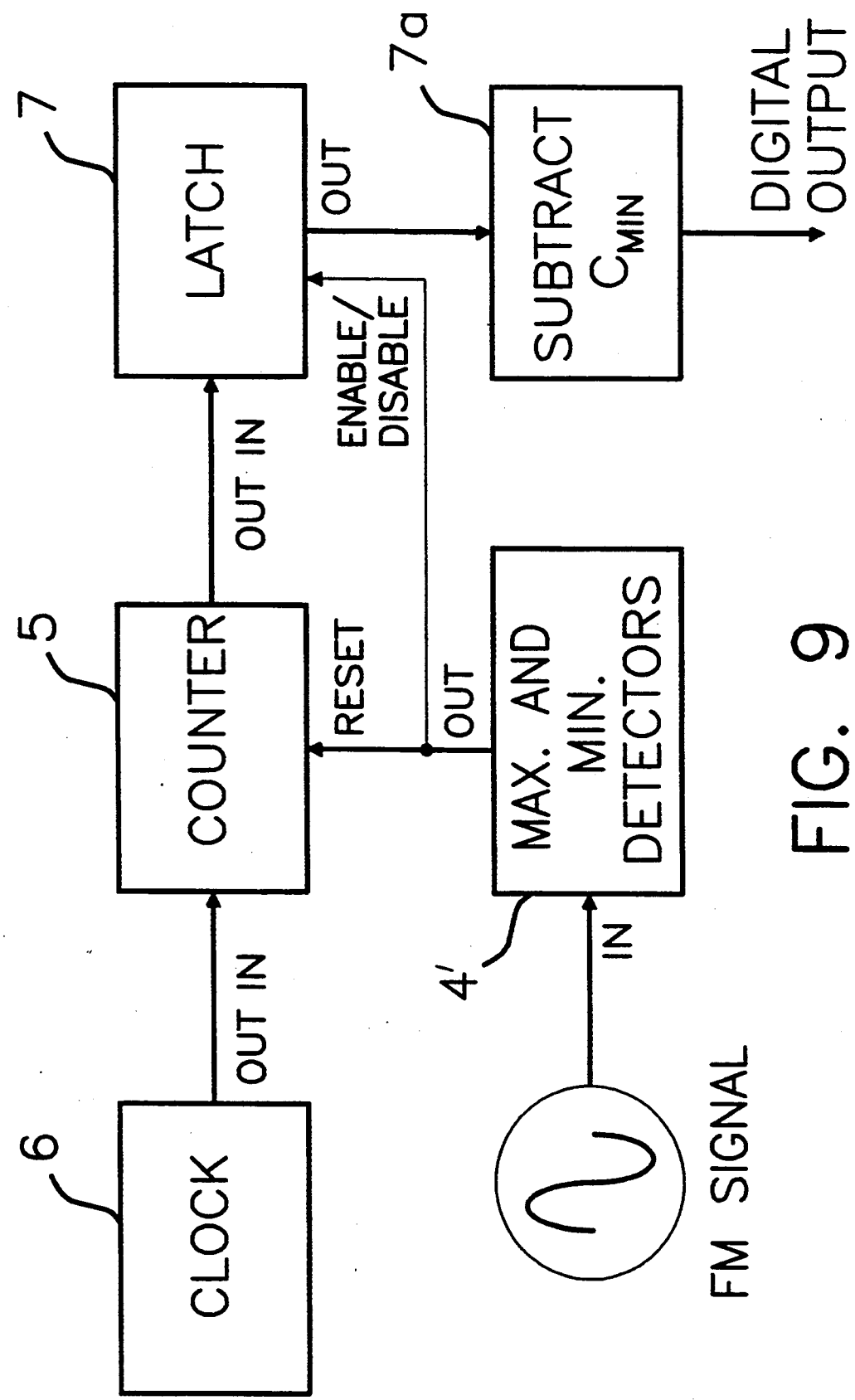
FIG. 9 is a schematic illustrating an alternative time encoding circuit 3 from that disclosed in FIG. 3.

FIG. 9 is a schematic illustrating an alternative time encoding circuit 3 from that disclosed in FIG. 3 above. The time encoding circuit 3 derives the frequency of the modulated signal by recording the time taken for the phase angle of the modulated signal to rotate through a given angle. The given angle may be $n\pi$ radians and may be measured between maxima and minima of the signal. The maxima and minima of the signal is detected by maxima and minima peak detector 4' in place of the zero crossing detector 4 shown in FIG. 3.

Figure 10:
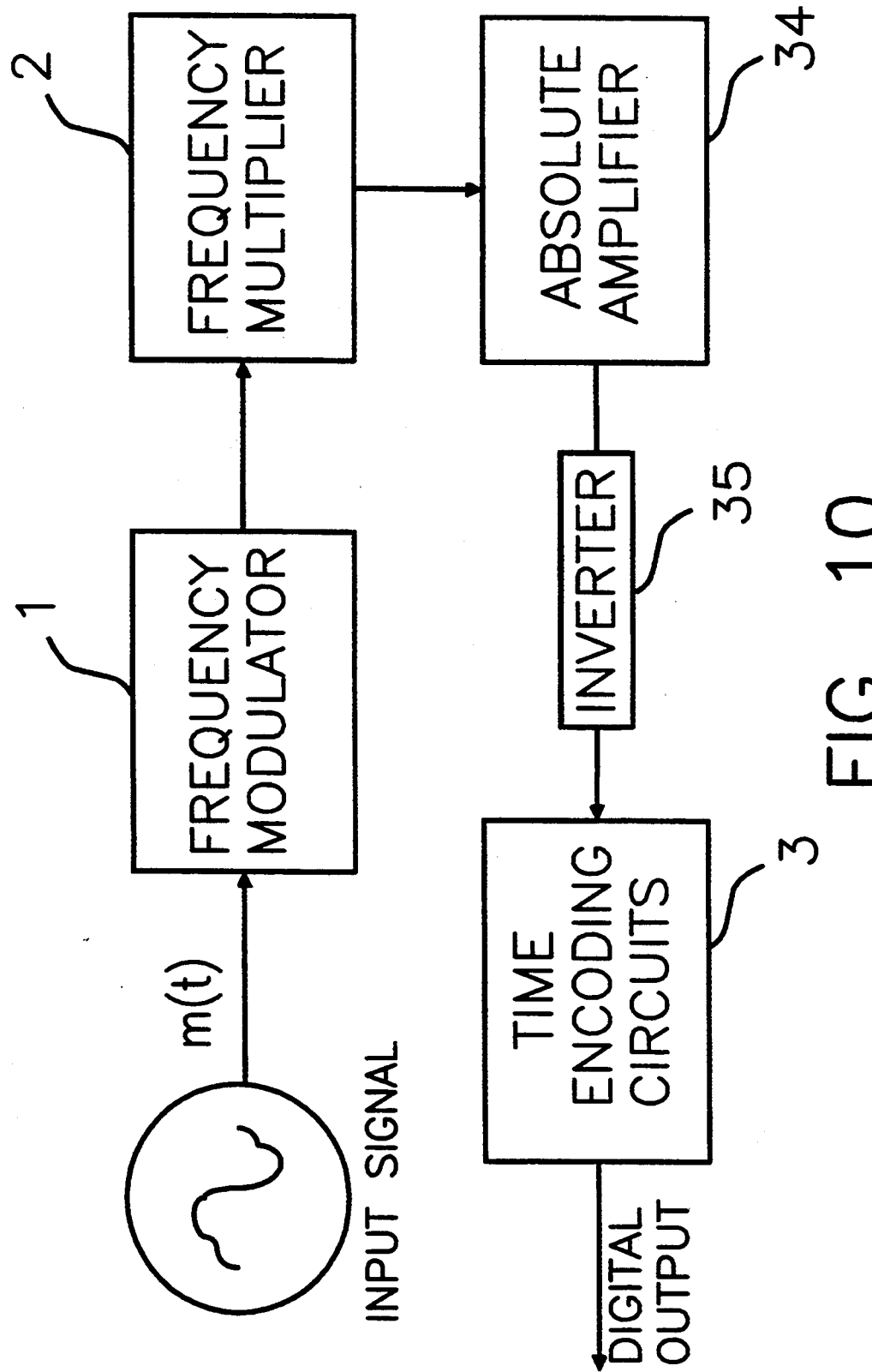
FIG. 10 is a schematic illustrating an alternative analogue to digital converter from that disclosed in FIG. 1.
Figure 11:
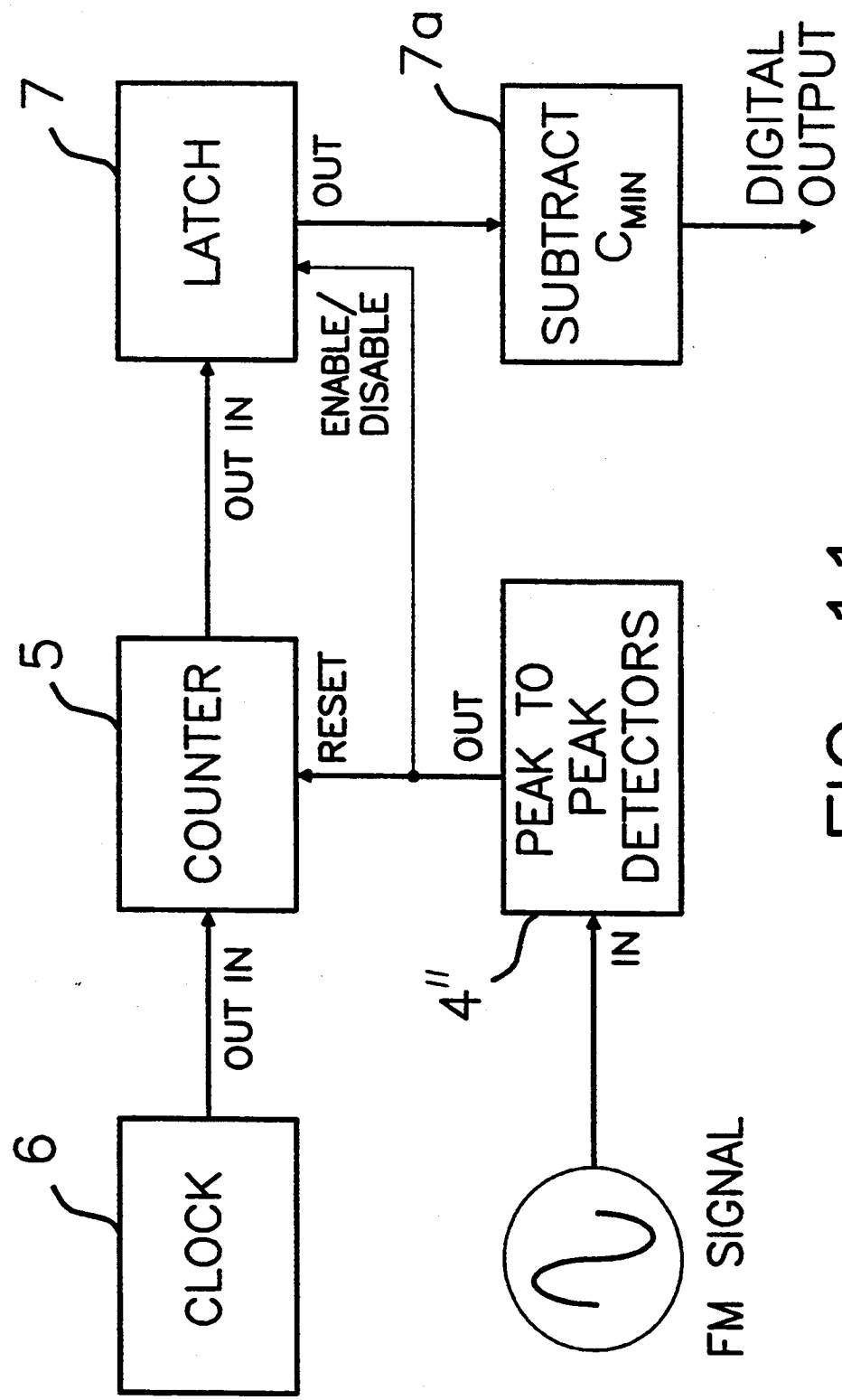
FIG. 11 is a schematic illustrating an alternative time encoding circuit from those disclosed in FIGS. 3 and 9.

FIG. 10 is a schematic illustrating an alternative analogue to digital converter from that disclosed in FIG. 1 above, and FIG. 11 is a schematic illustrating an alternative time encoding circuit from those disclosed in FIGS. 3 and 9 above. In FIG. 10, the modulated signal undergoes full-wave rectification and inversion using, for example, an absolute amplifier 34 and an inverter 35, respectively. The time encoding circuit 3 derives the frequency of the modulated signal by recording the time taken for the phase angle of the modulated signal to rotate through a given angle. The given angle may be $n\pi$ radians and may be measured between successive maxima of the signal. In FIG. 11, the successive maxima of the signal are detected by the peak to peak detector 4" in place of the zero crossing detector 4 shown in FIG. 3 and the maxima and minima detector 4' in FIG. 9.

CONCLUSION

This concludes the description of the preferred embodiment of the invention. The following paragraphs describe some of the applications for the present invention. Using the present invention in various applications will enhance the volume of information processed while concurrently reducing the processing time.

For example, the A/D converters of the present invention could be applied to sound recording and reproduction, e.g., pre-recorded audio advertising systems, cinema sound installations, digital tape recorders, marine data recorders, sound editing equipment, film sound recording and playback equipment, multi track tape recorders, and compact disc players.

The A/D converters of the present invention could also be applied to test and measurement applications, e.g., high speed data acquisition, sonar systems, military, commercial and scientific, high energy physics, fluid flow analysis, high speed instrumentation, radar system processing, direct current measurement, high speed digital storage oscilloscopes, wide band data acquisition systems, process control/monitoring circuits, medical imaging, cat and magnetic resonance, vibration analysis, waveform/transient recorders, direct digital synthesis (DDS), arbitrary wave form synthesis, and high speed imaging.

The A/D converters of the present invention could be applied to electronic micro-circuits, e.g., integrated circuits and micro assemblies, digital monolithic integrated circuits, digital non-monolithic integrated circuits, hybrid integrated circuits, and other electronic integrated circuits and micro-assemblies.

The A/D converters of the present invention could be applied to video, e.g., video recording equipment, video recording equipment for special airborne military application, optical video discs, video scramblers, interactive video equipment, video image recorders, video cameras for scientific military applications, video decoders, video encoders, high speed video systems, computer compatible video cameras, expanded band width video processing equipment, compressed band width video processing equipment, video time base corrector, and digital and frame storage and time base corrector synchronizers.

Finally, the A/D converters of the present invention could be applied to high speed computers and high definition TV.

In summary, an analogue to digital converter has been described that has an input for receiving an analogue signal and a frequency modulator for modulating the frequency of a carrier signal in dependence upon the analogue input signal. A digital counter counts the time between successive zero crossings of the modulated signal to provide digital signals representative of the analogue input signal.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An analogue to digital converter comprising an input for receiving an analogue signal, modulating means for modulating the angle of a carrier signal in dependence upon the analogue input signal, means for deriving from the modulated signal a time measurement taken for a phase angle of the modulated signal to rotate through a known angle, and means for producing a digital representation of the time measurement.

2. An analogue to digital converter according to claim 1, wherein the modulating means is a frequency modulator arranged to modulate the frequency of the carrier signal.

3. An analogue to digital converter according to claim 2, wherein the carrier is a sinusoidal carrier.

4. An analogue to digital converter according to claim 1, wherein the known angle is n$\pi$ radians where n is an integer.

5. An analogue to digital converter according to claim 4, wherein n=1.

6. An analogue to digital converter according to claim 1, wherein the means for deriving comprises means for measuring a time between successive events in the modulated signal, wherein the successive events are selected from a group comprising:

(1) a first peak to a subsequent peak,
(2) a first trough to a subsequent trough,
(3) a zero crossing to a subsequent peak,
(4) a peak to a subsequent zero crossing,
(5) a zero crossing to a subsequent trough, and
(6) a trough to a subsequent zero crossing.

7. An analogue to digital converter according to claim 6, the means for measuring comprises means for transmitting a pulse to a digital counter at an occurrence of the successive events.

8. An analogue to digital converter according to claim 1, wherein the modulating means is arranged to produce the modulated signal as a continuously varying function of the analogue input signal.

9. An analogue to digital converter according to claim 8, comprising a frequency multiplier connected between the modulating means and the means for deriving and arranged to multiply the frequencies of the modulated signal.

10. A digital to analogue converter comprising an input for receiving digital signals and means for controlling the delay of the conversion of successive received digital signals by amounts dependent upon the values of the signals.

11. A digital to analogue converter according to claim 10, comprising means for reconstituting a modulated signal from the received digital signals.

12. A digital to analogue converter comprising an input for receiving digital signals and means for controlling the delay of the conversion of successive received digital signals by amounts dependent upon the values of the signals and means for reconstituting a modulated signal from the received digital signals, wherein the reconstituting means comprising means for converting the digital signals into an intermediate analogue signal corresponding to the value of the digital signal and a voltage controlled oscillator having as its input the intermediate analogue signal.

13. A digital to analogue converter according to claim 12, wherein the reconstituting means comprising an oscillator arranged to have its resonant frequency dependent upon the value of an inductance, the value of the inductance arranged to be dependent upon the received digital signals.

* * * * *